United States Patent
Bae et al.

(10) Patent No.: US 6,831,454 B2
(45) Date of Patent: Dec. 14, 2004

(54) INDEXING DEVICE IN SEMICONDUCTOR DEVICE HANDLER AND METHOD FOR OPERATING THE SAME

(75) Inventors: Gil Ho Bae, Chinhae-shi (KR); Seung Hwan Kim, Chonan-shi (KR); Yon Choul Baek, Seoul (KR)

(73) Assignee: Mirae Corporation, Choongchungnam-Do (KR)

( * ) Notice: Subject to any disclaimer, the term of this patent is extended or adjusted under 35 U.S.C. 154(b) by 0 days.

(21) Appl. No.: 10/368,363

(22) Filed: Feb. 20, 2003

(65) Prior Publication Data

US 2004/0164723 A1 Aug. 26, 2004

(51) Int. Cl.[7] .............................................. G01R 31/26
(52) U.S. Cl. ..................................... 324/158.1; 324/765
(58) Field of Search ............................. 324/765, 158.1, 324/754; 414/404, 225, 940; 209/573, 572, 571

(56) References Cited

U.S. PATENT DOCUMENTS

| | | | | |
|---|---|---|---|---|
| 5,184,068 A | * | 2/1993 | Twigg et al. ................ | 324/755 |
| 5,650,732 A | * | 7/1997 | Sakai .......................... | 324/755 |
| 6,444,935 B1 | * | 9/2002 | DeGraw ...................... | 209/573 |
| 6,518,745 B2 | * | 2/2003 | Kim et al. ................ | 324/158.1 |
| 6,563,331 B1 | * | 5/2003 | Maeng ........................ | 324/760 |

* cited by examiner

*Primary Examiner*—David Zarneke
*Assistant Examiner*—Jimmy Nguyen
(74) *Attorney, Agent, or Firm*—Fleshner & Kim, LLP

(57) ABSTRACT

An indexing device in a semiconductor device handler, and a method for operating the same, utilizes a plurality of pairs of loading shuttles and unloading shuttles located on both sides of test sockets. Index heads move over and across the test sockets and the loading/unloading shuttles. While one of the index heads holds devices that are being tested, the other index head unloads tested semiconductor devices on one of the unloading shuttles, receives semiconductor devices to be tested from a loading shuttle, and stands by in the vicinity of the test sockets. This allows the semiconductor devices held by the index head at the stand by position to be immediately inserted into the test socket for testing when the other index head moves for unloading the tested semiconductor devices from the test sockets. As a result, an indexing time period is minimized, a size of the device can be reduced, and easy maintenance can be carried out.

20 Claims, 6 Drawing Sheets

INDEXING DEVICE IN SEMICONDUCTOR DEVICE HANDLER AND METHOD FOR OPERATING THE SAME

BACKGROUND OF THE INVENTION

1. Field of the Invention

The present invention relates to a handler for testing semiconductor devices, and mote particularly, to an indexing device in a semiconductor device handler and a method for operating the same. During the method, a semiconductor device is mounted in a test socket, the device is tested, and the device is then removed from the test socket.

2. Background of the Related Art

In general, semiconductor devices, fabrication of which is just finished on a production line, are tested for defects before shipment. The handler is an apparatus for testing the semiconductor device in association with a separate tester which actually carries out the semiconductor device test.

In general, the handler transports semiconductor devices held in trays between processes automatically. The handler fits the device to the test socket at a test site for desired tests, classifies the semiconductor devices according to a result of the tests, and unloads the devices to output trays. The device for fitting the semiconductor device to the test socket and removing the tested semiconductor device from the test socket and transporting to a predetermined location is called an indexing device.

There are a variety of indexing devices that have been developed recently. The new indexing devices are designed to reduce an index time period. For reference, the index time period is a time period from finishing a test of one semiconductor device to starting a test of another semiconductor device.

However, a related art indexing device, such as the indexing device disclosed in Japanese Laid Open Patent No. H10-82830 (Mar. 31, 1998) has a limitation in reducing the index time period because the indexing heads for holding the semiconductor devices are dependent on one another. In the related art index device, two index heads are mechanically interlocked, such that when one index head is involved in an actual test, the other index head only loads or unloads at a loading stage or unloading stage. Moreover, since the loading stage and the unloading stage in the related art indexing device are designed to move only in a longitudinal direction, an overall length of the handler is long and difficult to maintain.

SUMMARY OF THE INVENTION

An object of the invention is to solve at least the above problems and/or disadvantages and to provide at least the advantages described hereinafter.

Accordingly, the present invention is directed to an indexing device in a semiconductor device handler and a method for operating the same that substantially obviates one or more of the problems due to limitations and disadvantages of the related art.

An object of the present invention is to provide an indexing device in a semiconductor device handler and a method for operating the same, in which index heads in an indexing device are designed to move independently without making a system thereof complicated, for minimizing an index time period, reducing a size of the handler, and permitting easy maintenance.

To achieve these and other advantages and in accordance with the purpose of the present invention, as embodied and broadly described, the indexing device in a semiconductor device handler is positioned adjacent test sockets in a test site of a handler body. A first loading shuttle and a second loading shuttle are positioned on left and right sides of the test sockets on a line for supplying the semiconductor devices to be tested. A first unloading shuttle, and a second unloading shuttle are arranged on a line on left and right sides of the first loading shuttle and the second loading shuttle to form pairs therewith for receiving tested semiconductor devices. Opposite frames are located over and across the test sockets in left and right directions. A first index head and a second index head, respectively, are fitted to the frames via guide members such that the first and second indexing heads are movable individually in left and right directions. The first and second indexing heads are for holding and transporting the semiconductor devices between the test sockets and the first, or second loading shuttle or the first, or second unloading shuttle. Driving means are provided for individual movement of the first index head and the second index head along the respective frames.

In another aspect of the present invention, there is provided a method for operating an indexing device including the steps of: supplying semiconductor devices to be tested to a first loading shuttle, using a first index head to mount the semiconductor devices to test sockets, and carrying out a test on the semiconductor devices. While the test is carried out on the devices held by the first index head, semiconductor devices to be tested are supplied by a second loading shuttle. A second index head holds the semiconductor devices supplied by the second loading shuttle, and stands by at a second standby place in the vicinity of the test socket. After the testing of the semiconductor devices held by the first index head is finished, the first index head transports the semiconductor devices to a first unloading shuttle, and the second index head immediately moves the semiconductor devices it holds into the test sockets and testing on these devices is conducted. While testing is conducted on the semiconductor devices held by the second index head, semiconductor devices are again supplied by the first loading shuttle, to the first index head, which then holds the semiconductor devices supplied by the first loading shuttle, and stands by at a standby place in the vicinity of the test socket. When the testing of the semiconductor devices held by the second index head is finished, the second index head transports the semiconductor devices to the second unloading shuttle, and the first index head immediately moves the semiconductor devices it holds into the test sockets. These steps are repeated to accomplish testing of all devices supplied to the handler.

It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Reference will now be made in detail to the preferred embodiments of the present invention, examples of which are illustrated in the accompanying drawings.

Figure 1:
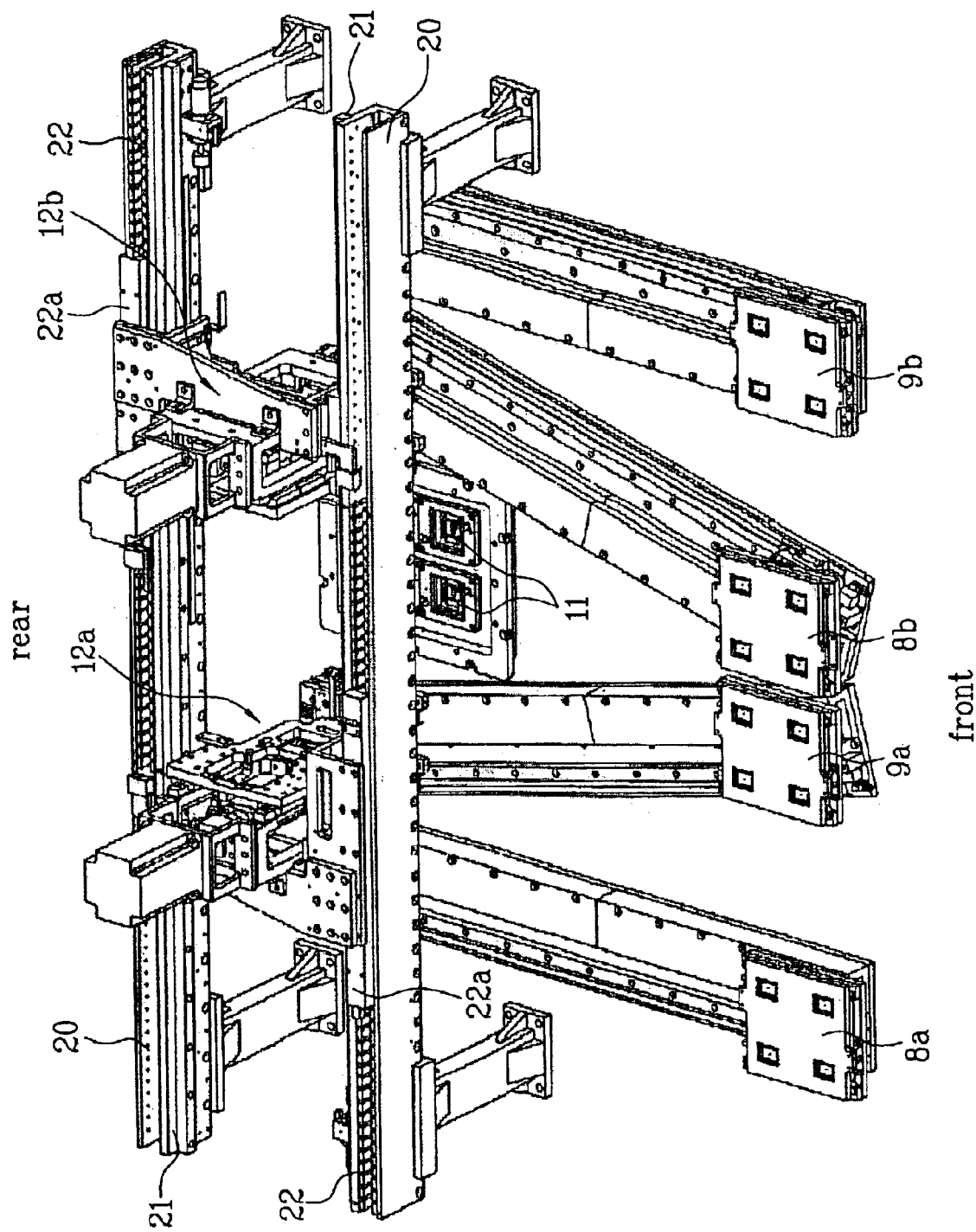
FIG. 1 illustrates a perspective view of an indexing device of a handler in accordance with a preferred embodiment of the present invention.
Figure 2:
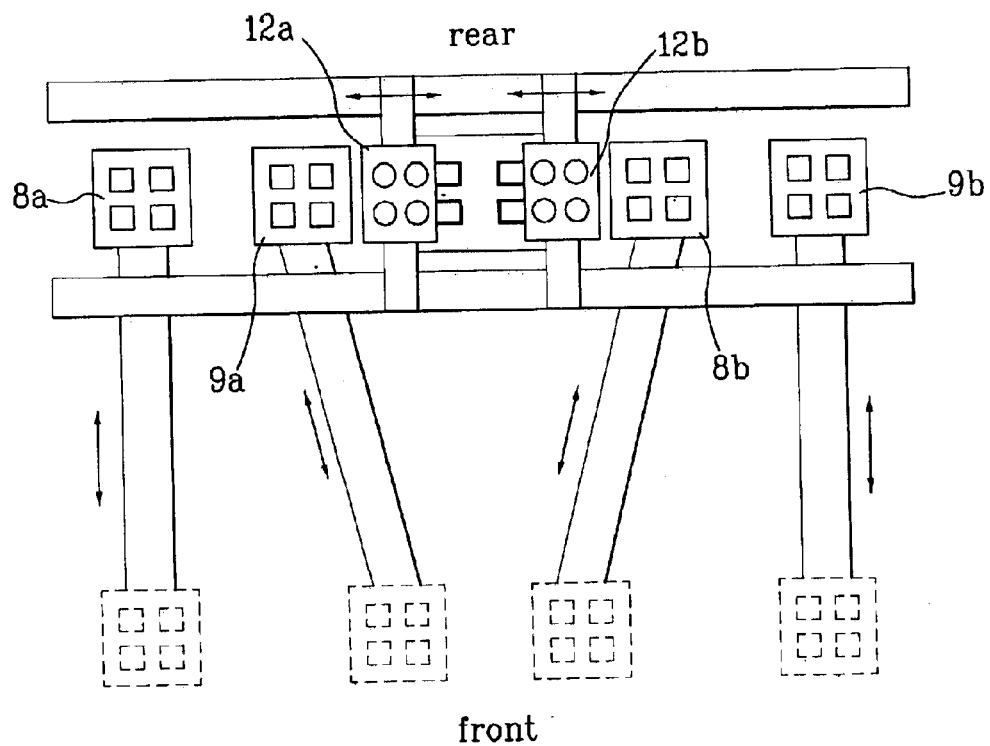
FIG. 2 illustrates a plan view of the indexing device in FIG. 1, schematically.

Referring to FIGS. 1 and 2, the indexing device of the present invention includes test sockets 11 in a test site in one part of a handler body, for example, in a rear part of the body. The test sockets are electrically connected to an external test apparatus for fitting semiconductor devices thereto for electrical test. A plurality of pairs of first, and second loading shuttles 8a and 8b and first, and second unloading shuttles 9a and 9b are arranged on a line on both sides of the test sockets 11. The loading and unloading shuttles are movable forward/backward on the handler.

The first, or second loading shuttle 8a or 8b receives semiconductor devices to be tested from a separate picker robot (not shown) provided on the handler. The first and second loading shuttles 8a, 8b transport the semiconductor devices to both sides of the test socket 11 at the test site. The first, or second unloading shuttle 9a or 9b receives the tested semiconductor devices from the test sockets 11, and they transport the semiconductor devices to a front part of the handler body.

Though the embodiment is described assuming that the first loading shuttle 8a, the first unloading shuttle 9a, the test socket 11, the second unloading shuttle 8b, and the second unloading shuttle 9b are arranged in an order thereof starting from one side of the handler, the arrangement of the test sockets and the loading/unloading shuttles may be varied appropriately taking the entire handler system into account.

There are one pair of frames 20 located over the test site across the test sockets 11 and the first, and second loading/unloading shuttles 8a, 9a, 8b, and 9b. A first index head 12a and a second index head 12b are movable in a lateral direction on a guide member, such as a linear movement (LM) guide 21, mounted on the frames 20.

The first index head 12a and the second index head 12b are respectively fitted to movers 22a of linear motors 22 on the frames 20 so as to be movable individually along the LM guides 21 of the frames 20 as the linear motors 22 are operated, respectively. Other movement mechanisms could also be used to individually control the first and second index heads. For instance, electric motors and belts or drive screws could be used in place of the linear motors.

The first and second index heads 12a, 12b have a plurality of holding members (not shown) at a lower end thereof for holding a plurality of semiconductor devices by vacuum. The index heads transport the semiconductor devices between the test sockets 11 and the first, or second loading shuttle 8a and 8b, or the first, or second unloading shuttle 9a or 9b.

FIGS. 3A~3F illustrate indexing devices seen from rear of a handler body. Each figure shows a step of a process for testing semiconductor devices as operation of the indexing device in FIG. 1 progresses. A method for operating an indexing device of the present invention will be explained, with reference to FIGS. 3A~3F, and 4 in detail.

Figure 3A:
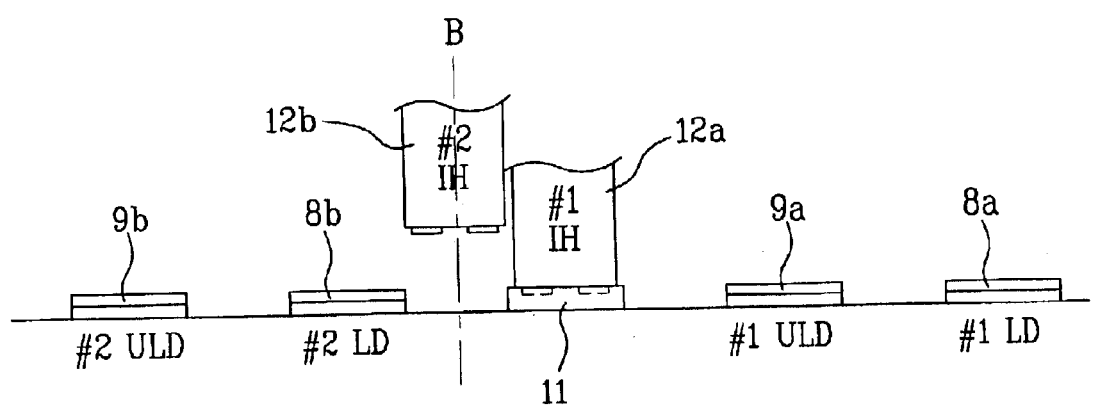
FIGS. 3A~3F illustrate indexing devices seen from rear of a handler body each showing the steps of a process for testing a semiconductor device as operation of the indexing device in FIG. 1 progresses, schematically.

Referring to FIG. 3A, when a picker robot (not shown) of the handler supplies semiconductor devices to be tested to the first loading shuttle 8a, the first index head 12a transports the semiconductor devices on the first loading shuttle 8a to the test sockets 11 and presses the devices down into the sockets so that testing can be conducted.

While the testing is carried out on the devices held by the first index head 12a, semiconductor devices to be tested are supplied by the second loading shuttle 8b, to the second index head 12b. The second index head 12b picks up the devices supplied by the second loading shuttle 8b and holds the semiconductor devices at a second standby place B between the test socket 11 and the second loading shuttle 8b.

Figure 3B:
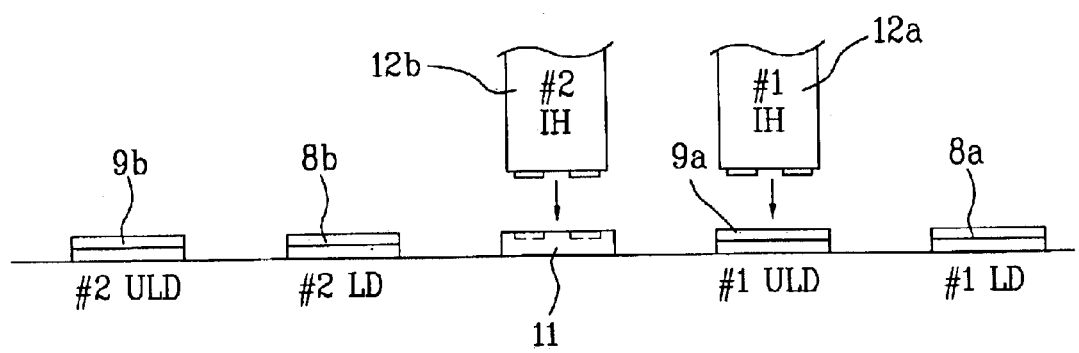

Then, referring to FIG. 3B, after the testing of the semiconductor devices held by the first index head 12a are finished, the first index head 12a transports the semiconductor devices to the first unloading shuttle 9a and unloads the semiconductor devices thereon. At the same time, the second index head 12b moves over the test sockets 11, and presses the semiconductor devices it holds into the test sockets 11 so that testing of these devices can be conducted.

Figure 3C:
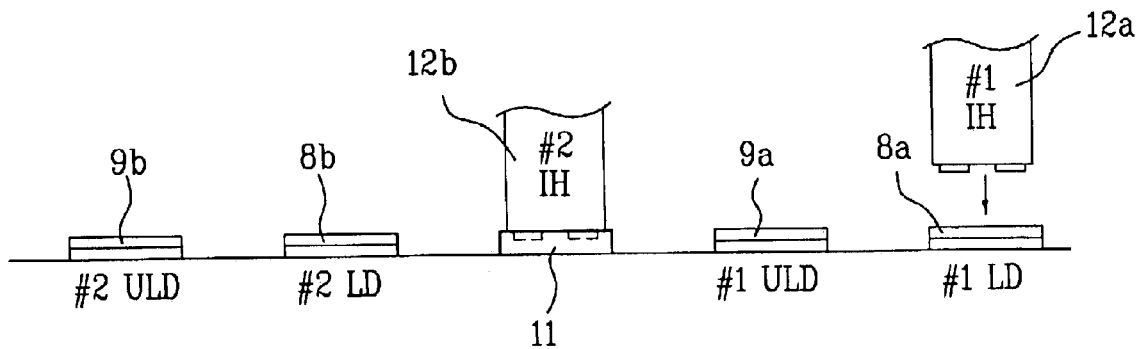
Figure 3D:
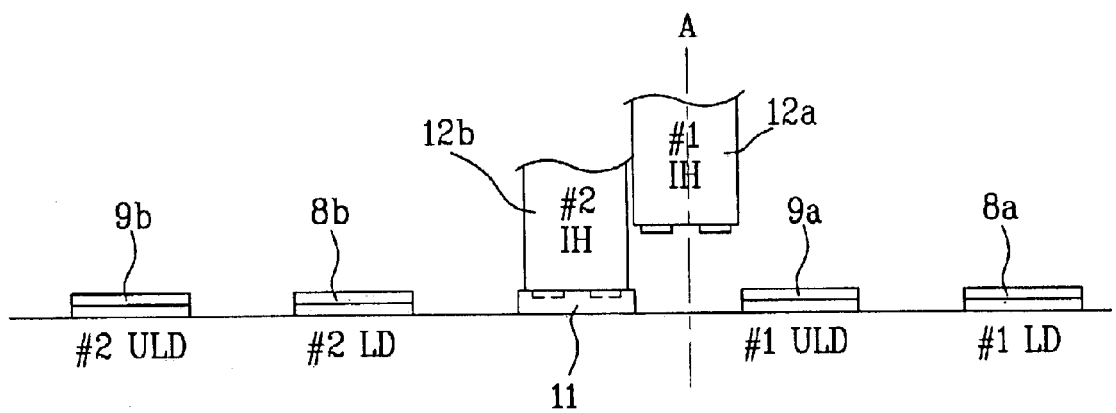

While the semiconductor devices held by the second index head 12b are tested, semiconductor devices to be tested are supplied by the first loading shuttle 8a to the first index head 12a, as shown in FIG. 3C. The first index head 12a picks up these devices and moves to a first standby place A in the vicinity of the test sockets, as shown in FIG. 3D.

Figure 3E:
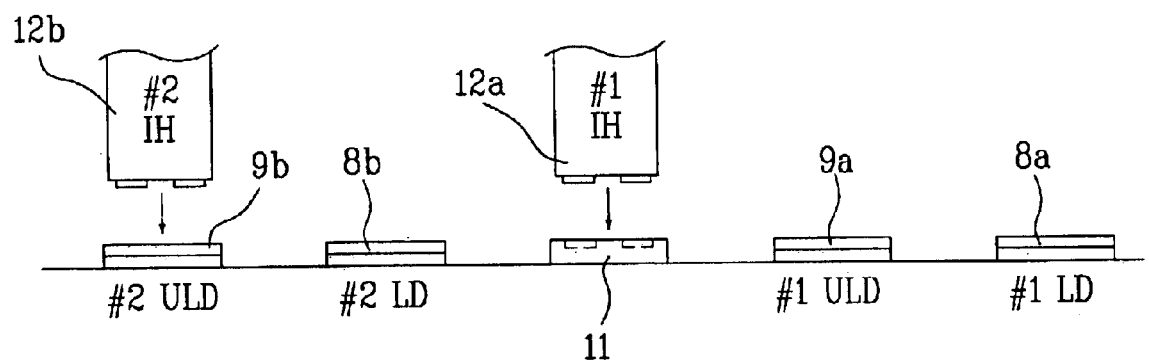

Referring to FIG. 3E, when the testing of the semiconductor devices held by the second index head 12b is finished, the second index head 12b moves to a second unloading shuttle 9b, and unloads the semiconductor devices. At the same time, the first index head 12a moves over the test sockets 11, and pushes the semiconductor devices into the test sockets 11.

Figure 3F:
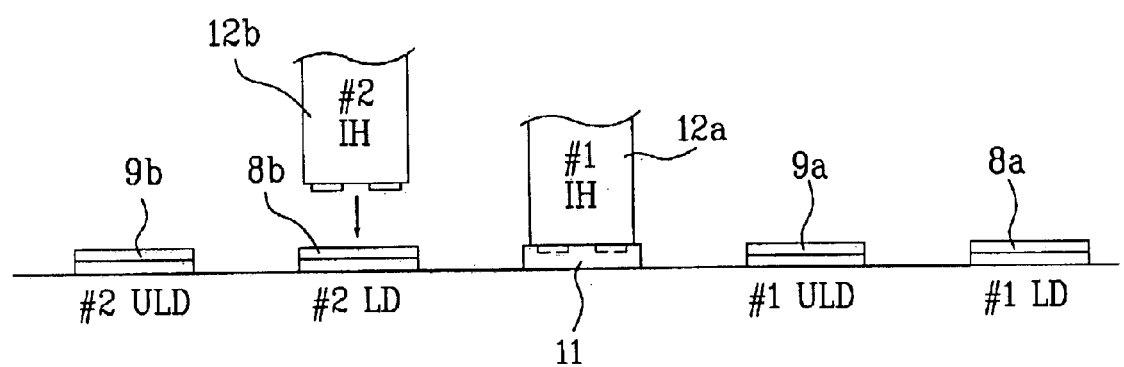

Then, referring to FIG. 3F, additional semiconductor devices to be tested are supplied by the second loading shuttle 8b, to the second index head. The second index head 12b picks up the devices and moves to the second standby place B, as shown in FIG. 3A. The indexing device repeats the process as shown in FIGS. 3A~3F in succession, for testing the semiconductor devices.

During the testing process the first, and second loading shuttles 8a and 8b move forward and backward according to a given sequence, to receive semiconductor devices from a loading picker robot (not shown) in front of the test site. The first, and second unloading shuttles 9a and 9b also move forward and backward according to a given sequence, to transport tested semiconductor devices from both sides of the test sockets 11 to the front of the test site.

As has been explained, the indexing device in a semiconductor device handler and method for operating the same have the following advantages. By designing index heads so that they are movable independently, by arranging loading shuttles and unloading shuttles on left and right sides of the test sockets for supplying and recovering the semiconductor devices, and by making one of the index heads stand at a standby place in the vicinity of the test sockets while another one of the index heads is involved in the testing at the test socket, an index time period can be minimized, an entire size of the handler can be reduced, and maintenance can be made easy.

Figure 4:
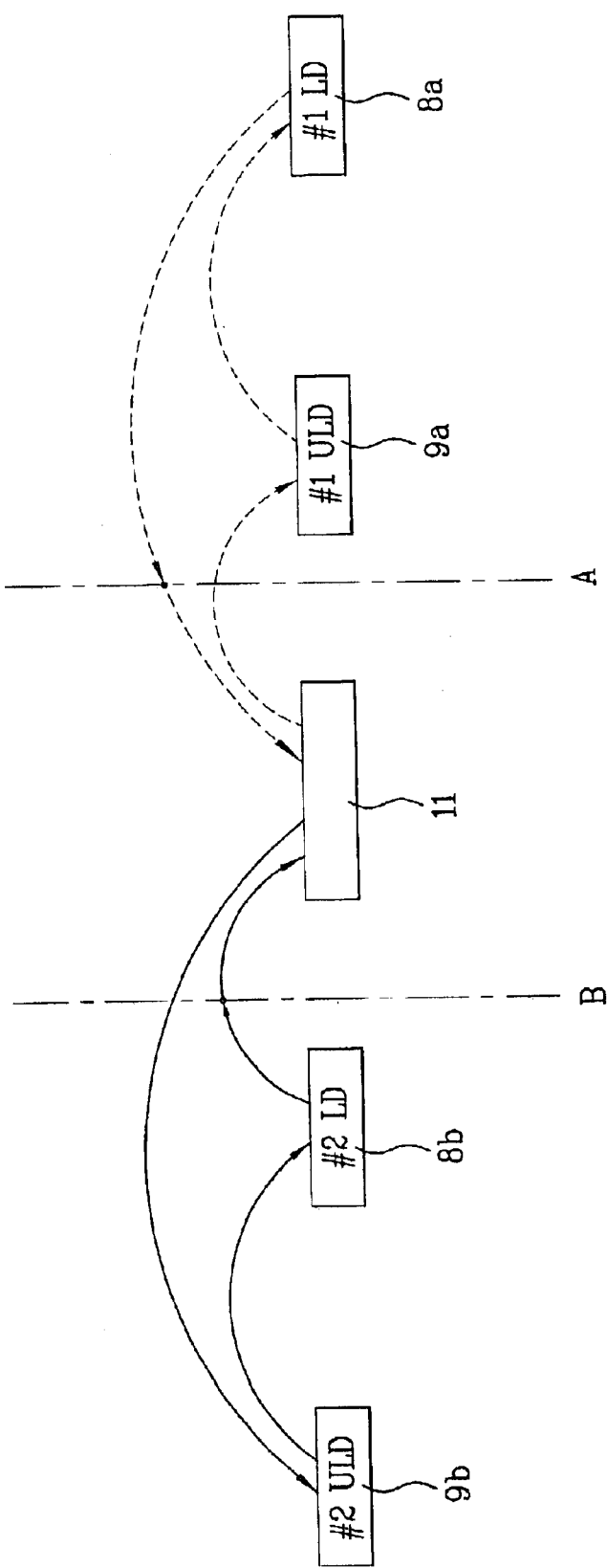
FIG. 4 illustrates moving paths of the index heads in the indexing device of the present invention in FIGS. 3A~3F.

FIG. 4 shows the path of movement of the first and second index heads as testing of semiconductor devices occurs.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor device handler, comprising:
   test sockets located at a test site of the handler;
   a first loading shuttle and a second loading shuttle located on opposite sides of the test sockets and configured to supply semiconductor devices to be tested;
   a first unloading shuttle, and a second unloading shuttle arranged on opposite sides of the test sockets and configured to receive tested semiconductor devices;
   at least one support frame located adjacent and over the test sockets;
   a first index head and a second index head fitted to the at least one support frame, wherein the first and second index heads are independently moveable along the at least one support frame, and wherein the first and second index heads are configured to transport semiconductor devices between the test sockets, the first or second loading shuttle and the first or second unloading shuttle; and
   first and second drivers for independently moving the first index head and the second index head, respectively, along the at least one support frame.

2. The semiconductor device handler of claim 1, wherein the first and second drivers are linear motors respectively coupled to the first index head and the second index head.

3. The semiconductor device handler of claim 1, wherein the first loading shuttle and the second loading shuttle are moveable between device loading positions at which semiconductor devices are loaded into the first and second loading shuttles by a loading picker, and device supply positions, at which the first and second index heads pick up semiconductor devices from the first and second loading shuttles, respectively.

4. The semiconductor device handler of claim 3, wherein the first unloading shuttle and the second unloading shuttle are moveable between device receiving positions at which semiconductor devices are loaded into the first and second unloading shuttles by the first and second index heads, respectively, and device unloading positions, at which semiconductor devices are unloaded from the first and second unloading shuttles by an unloading picker.

5. The semiconductor device handler of claim 4, wherein the first index head is configured to move semiconductor devices from the first loading shuttle to the test sockets, and then from the test sockets to the first unloading shuttle, and wherein the second index head is configured to move semiconductor devices from the second loading shuttle to the test sockets, and then from the test sockets to the second unloading shuttle.

6. The semiconductor device handler of claim 5, wherein when the first index head holds semiconductor devices in the test sockets during testing, the second index head holds semiconductor devices at a first standby position located immediately adjacent to the test sockets, and wherein when the second index head holds semiconductor devices in the test sockets during testing, the first index head holds semiconductor devices at a second standby position located immediately adjacent to the test sockets.

7. The semiconductor device handler of claim 6, wherein when the first index head removes semiconductor devices from the test sockets after testing, the second index head immediately inserts semiconductor devices into the test sockets for testing, and wherein when the second index head removes semiconductor devices from the test sockets after testing, the first index head immediately inserts semiconductor devices into the test sockets for testing.

8. A method for operating a semiconductor device handler having first and second loading shuttles arranged on opposite sides of a set of test sockets, first and second unloading shuttles arranged on opposite sides of the test sockets, and first and second index heads positioned above the test sockets and configured to move independently along a frame of the handler, the method comprising:

(a) supplying semiconductor devices to be tested to the first index head with the first loading shuttle;
   (b) moving the semiconductor devices supplied by the first loading shuttle to the test sockets with the first index head;
   (c) testing the semiconductor devices held by the first index head with the test sockets;
   (d) while testing the semiconductor devices held by the first index head, supplying semiconductor devices to be tested to the second index head with the second loading shuttle, picking up the semiconductor devices supplied by the second loading shuttle with the second index head, and moving the second index head to a first standby position immediately adjacent the test sockets;
   (e) after the testing of the semiconductor devices held by the first index head, moving the tested semiconductor devices to the first unloading shuttle with the first index head, and simultaneously moving the semiconductor devices held by the second index head into the test sockets with the second index head;
   (f) while testing the semiconductor devices held by the second index head, supplying semiconductor devices to be tested to the first index head with the first loading shuttle, picking up the semiconductor devices supplied by the first loading shuttle with the first index head, and moving the first index head to a second standby position immediately adjacent the test sockets;
   (g) after the testing of the semiconductor devices held by the second index head, moving the tested semiconductor devices to the second unloading shuttle with the second index head, and simultaneously moving the semiconductor devices held by the first index head into the test sockets with the first index head; and
   (h) repeating steps (d)–(g) until all semiconductor devices requiring testing have been tested.

9. The method of claim 8, wherein step (a) comprises moving the first loading shuttle between a device loading position at which semiconductor devices are loaded into the first loading shuttle and a device supply position at which the first index head picks up semiconductor devices from the first loading shuttle.

10. The method of claim 8, wherein the first and second loading shuttles move back and forth between device loading positions at which semiconductor devices are loaded into the first and second loading shuttles by a loading picker, and device supply positions, at which the first and second index heads pick up semiconductor devices from the first and second loading shuttles, respectively.

11. The method of claim 10, wherein the first unloading shuttle and the second unloading shuttle move back and forth between device receiving positions at which semiconductor devices are loaded into the first and second unloading shuttles by the first and second index heads, respectively, and device unloading positions, at which semiconductor devices are unloaded from the first and second unloading shuttles by an unloading picker.

12. A semiconductor device handler, comprising:

a testing device having one or more test sockets;

first and second loading shuttles located on opposite sides of the one or more test sockets and configured to supply semiconductor devices to be tested to the test sockets; and first and second unloading shuttles arranged adjacent the one or more test sockets and configured to receive tested semiconductor devices.

13. The semiconductor device handler of claim 12, further comprising first and second index heads configured to transport semiconductor devices, respectively, between the test sockets, the first and second loading shuttles and the first and second unloading shuttles.

14. The semiconductor device handler of claim 13, further comprising first and second drivers configured to independently move the first and second index heads, respectively.

15. The semiconductor device handler of claim 14, wherein the first and second drivers comprise linear motors respectively coupled to the first and second index heads.

16. A method for operating a semiconductor device handler having first and second loading shuttles arranged on opposite sides of one or more test sockets, first and second unloading shuttles arranged on opposite sides of the one or more test sockets, and first and second index heads positioned, respectively, above the one or more test sockets, the method comprising:

(a) alternately supplying semiconductor devices to opposite sides of the one or more test sockets using the first and second loading shuttles;

(b) thereafter transporting the semiconductor devices away from opposite sides of the one or more test sockets upon completion of testing alternately using the first and second unloading shuttles; and (c) repeating steps (a)–(b) until all semiconductor devices requiring testing have been tested.

17. The method of claim 16, wherein alternately supplying semiconductor devices to opposite sides of the one or more test sockets using the first and second loading shuttles comprises loading semiconductor devices to be tested onto the second loading shuttle, providing the loaded semiconductor devices to the second index head, and transporting the semiconductor devices to a first standby position adjacent the one or more test sockets while semiconductor devices positioned at the one or more test sockets by the first index head are tested.

18. The method of claim 17, wherein thereafter transporting the semiconductor devices away from opposite sides of the one or more test sockets upon completion of testing alternately using the first and second unloading shuttles comprises the first index head thereafter removing the tested semiconductor devices from the one or more test sockets, while the second index head simultaneously moves the semiconductor devices to be tested from the first standby position to the one or more test sockets.

19. The method of claim 18, wherein alternately supplying semiconductor devices to opposite sides of the one or more test sockets using the first and second loading shuttles further comprises loading semiconductor devices to be tested onto the first loading shuttle, providing the loaded semiconductor devices to the first index head, and transporting the semiconductor devices to a second standby position adjacent the one or more test sockets while the semiconductor devices positioned at the one or more test sockets by the second index head are tested.

20. The method of claim 19, wherein thereafter transporting the semiconductor devices away from opposite sides of the one or more test sockets upon completion of testing alternately using the first and second unloading shuttles further comprises the second index head thereafter removing the tested semiconductor devices from the one or more test sockets while the first index head simultaneously moves the semiconductor devices to be tested from the second standby position to the one or more test sockets.

* * * * *